United States Patent
Di Pendina et al.

(10) Patent No.: US 9,311,994 B2
(45) Date of Patent: Apr. 12, 2016

(54) NON-VOLATILE MEMORY DEVICE

(71) Applicants: Commissariat à L'énergie Atomique et aux énergies Alternatives, Paris (FR); Centre National de la Recherche Scientifique, Paris (FR)

(72) Inventors: Grégory Di Pendina, Echirolles (FR); Virgile Javerliac, Grenoble (FR)

(73) Assignees: Commissariat à l'énergie atomique et aux énergies alternatives (FR); Centre National de la Recherche Scientifique (FR)

( * ) Notice: Subject to any disclaimer, the term of this patent is extended or adjusted under 35 U.S.C. 154(b) by 0 days.

(21) Appl. No.: 14/324,110

(22) Filed: Jul. 4, 2014

(65) Prior Publication Data

US 2015/0009744 A1 Jan. 8, 2015

(30) Foreign Application Priority Data

Jul. 5, 2013 (FR) ...................................... 13 56637

(51) Int. Cl.
*G11C 11/00* (2006.01)
*G11C 13/00* (2006.01)
(Continued)

(52) U.S. Cl.
CPC .......... *G11C 13/0021* (2013.01); *G11C 11/165* (2013.01); *G11C 13/0002* (2013.01); *G11C 14/0081* (2013.01)

(58) Field of Classification Search
CPC  H01L 45/146; H01L 45/126; G11C 13/0007; G11C 13/0002; G11C 17/165
USPC ......... 365/46, 55, 74, 97, 100, 131, 148, 158, 365/171, 173, 163
See application file for complete search history.

(56) References Cited

U.S. PATENT DOCUMENTS 4,006,469 A   2/1977   Leehan et al.
5,973,965 A   10/1999  Berthold et al.
(Continued)

FOREIGN PATENT DOCUMENTS

EP   1134746 A2   9/2001
FR   2966636 A1   4/2012
(Continued)

OTHER PUBLICATIONS

Balaguer Lopez, J., "Parent French Patent Application No. FR 13/56637 Search Report", Mar. 7, 2014, Publisher: inpi, Published in: FR.

(Continued)

*Primary Examiner* — Fernando Hidalgo
(74) *Attorney, Agent, or Firm* — Kaplan Breyer Schwarz & Ottesen, LLP

(57) ABSTRACT

The invention concerns a memory device comprising: a first memory cell comprising a first resistive non-volatile data storage element programmable to store a first bit of data; and a second memory cell comprising a second resistive non-volatile data storage element programmable to store a second bit of data; wherein said first resistive element is configured to have a first data retention duration, and said second resistive element is configured to have a second data retention duration different from said first data retention duration.

12 Claims, 5 Drawing Sheets

(51) Int. Cl.
*G11C 11/16* (2006.01)
*G11C 14/00* (2006.01)

(56) References Cited

U.S. PATENT DOCUMENTS

| | | | |
|---|---|---|---|
| 6,172,899 | B1 | 1/2001 | Marr et al. |
| 6,717,844 | B1 | 4/2004 | Ohtani |
| 7,495,945 | B2 | 2/2009 | Roehr |
| 7,760,538 | B1 | 7/2010 | Paak |
| 7,764,081 | B1 | 7/2010 | Tuan et al. |
| 7,796,417 | B1 | 9/2010 | Lewis |
| 8,154,916 | B2 | 4/2012 | Sugiyama et al. |
| 8,508,983 | B2 | 8/2013 | Wang et al. |
| 8,605,490 | B2 | 12/2013 | Fackenthal |
| 8,773,896 | B2 | 7/2014 | Shukh |
| 2003/0161184 | A1 | 8/2003 | Lee et al. |
| 2003/0204689 | A1 | 10/2003 | Shimoda |
| 2004/0125643 | A1 | 7/2004 | Kang et al. |
| 2004/0141363 | A1 | 7/2004 | Ohtsuka et al. |
| 2005/0128791 | A1 | 6/2005 | Kang |
| 2006/0181916 | A1 | 8/2006 | Roehr |
| 2007/0041242 | A1 | 2/2007 | Okazaki et al. |
| 2008/0089146 | A1 | 4/2008 | Fujito et al. |
| 2009/0109734 | A1 | 4/2009 | Hanafi |
| 2009/0190409 | A1 | 7/2009 | Dittrich et al. |
| 2009/0268513 | A1 | 10/2009 | De Ambroggi et al. |
| 2010/0080042 | A1 | 4/2010 | Lamorey |
| 2010/0188891 | A1 | 7/2010 | Taniguchi et al. |
| 2010/0202191 | A1 | 8/2010 | Ahn et al. |
| 2010/0208512 | A1 | 8/2010 | Ueda |
| 2010/0259975 | A1 | 10/2010 | Toda |
| 2010/0271866 | A1 | 10/2010 | Sakimura et al. |
| 2011/0085372 | A1 | 4/2011 | Fackenthal |
| 2011/0095255 | A1* | 4/2011 | Sumino et al. ............... 257/2 |
| 2011/0110142 | A1 | 5/2011 | Kitagawa et al. |
| 2011/0122709 | A1 | 5/2011 | Kim et al. |
| 2011/0208904 | A1 | 8/2011 | Fujito et al. |
| 2012/0001672 | A1 | 1/2012 | Barrow |
| 2013/0135008 | A1 | 5/2013 | Zhang et al. |
| 2014/0043062 | A1 | 2/2014 | Guillemenet et al. |
| 2014/0050012 | A1 | 2/2014 | Guillemenet et al. |
| 2014/0070844 | A1 | 3/2014 | Guillemenet et al. |
| 2014/0078810 | A1 | 3/2014 | Prenat et al. |
| 2014/0167816 | A1 | 6/2014 | Guillemenet et al. |
| 2014/0269003 | A1 | 9/2014 | Guillemenet et al. |
| 2015/0036415 | A1 | 2/2015 | DiPendina et al. |
| 2015/0084671 | A1 | 3/2015 | Prenat et al. |

FOREIGN PATENT DOCUMENTS

| | | | |
|---|---|---|---|
| FR | 2970589 | A1 | 7/2012 |
| FR | WO2012/098181 | * | 7/2012 |
| JP | 2003157671 | A | 5/2003 |
| WO | 2007045202 | A1 | 4/2007 |
| WO | 2008112746 | A2 | 9/2008 |
| WO | 2010065691 | | 6/2010 |

OTHER PUBLICATIONS

Balaguer Lopez, J., "European Search Report", dated Nov. 13, 2014, issued in corresponding EP Application No. 14175842.5.
"International Search Report", dated Jul. 19, 2013, issued in related International Application No. PCT/FR2013/050910 (counterpart to related U.S. Appl. No. 14/395,555).
"International Preliminary Report on Patentability", dated Jul. 23, 2013, issued in related International Application No. PCT/EP2012/050800 (counterpart to related U.S. Appl. No. 13/980,529).
Damien Czarik, "International Search Report" dated May 7, 2012, issued in related International Patent Application No. PCT/EP2012/050800 (counterpart to related U.S. Appl. No. 13/980,529).
Dylan C. White, "Non-Final Office Action" dated Dec. 29, 2014, issued in related U.S. Appl. No. 13/980,529.
"Final Office Action" dated Apr. 30, 2015, issued in related U.S. Appl. No. 13/980,529.
"International Preliminary Report on Patentability", dated Jul. 23, 2013, issued in related International Application No. PCT/EP2012/050798 (counterpart to related U.S. Appl. No. 13/980,555).
Damien Czarik, "International Search Report", dated Feb. 29, 2012, issued in related International Patent Application No. PCT/EP2012/050798 (counterpart to related U.S. Appl. No. 13/980,55).
"International Preliminary Report on Patentability", dated Jul. 23, 2013, issued in related International Application No. PCT/EP2012/050772 (counterpart to related U.S. Appl. No. 13/980,558).
"International Search Report", dated Jul. 12, 2012, issued in related International Patent Application No. PCT/EP2012/050772 (counterpart of U.S. Appl. No. 13/980,558).
Tan Nguyen, "Supplemental Notice of Allowance", dated Jan. 21, 2015, issued in related U.S. Appl. No. 13/980,558.
"Supplemental Notice of Allowance", dated Dec. 4, 2014, issued in related U.S. Appl. No. 13/980,558.
Nguyen, Tan, "Notice of Allowance", dated Sep. 26, 2014, issued in related U.S. Appl. No. 13/980,558.
"International Preliminary Report on Patentability", dated Jul. 23, 2013, issued in related International Application No. PCT/EP2012/050767 (counterpart to related U.S. Appl. No. 13/980,559).
"International Search Report", dated May 7, 2012, issued in related International Patent Application No. PCT/EP2012/050767 (counterpart to related U.S. Appl. No. 13/980,559).
"Notice of Allowance" dated Oct. 15, 2015 issued in related U.S. Appl. No. 13/980,559.
"NonFinal Office Action" dated May 19, 2015, issued in counterpart U.S. Appl. No. 13/980,559.
"French Search Report", dated Jun. 12, 2014, issued in French Application No. 13/57536 (counterpart to related U.S. Appl. No. 14/446,044).
"International Preliminary Report on Patentability", dated Dec. 17, 2013, issued in related International Application No. PCT/EP2012/061267 (counterpart to related U.S. Appl. No. 14/126,051).
Officer: Balaguer Lopez, J, "International Search Report", dated Sep. 6, 2012, issued in related International Application No. PCT/EP2012/061267 (counterpart to U.S. Appl. No. 14/126,051).
"Supplemental Notice of Allowance", dated Feb. 9, 2015, issued in related U.S. Appl. No. 14/126,051.
"Notice of Allowance", dated Sep. 26, 2014, issued in related U.S. Appl. No. 14/126,051.
"Supplemental Notice of Allowance", dated Feb. 20, 2015, issued in related U.S. Appl. No. 14/126,051.
"Supplemental Notice of Allowance", dated Jan. 2, 2015, issued in related U.S. Appl. No. 14/126,051.
Officer: Agnes Wittmann-Regis, "International Preliminary Report on Patentability", dated Dec. 17, 2012, issued in related International Patent Application No. PCT/EP2012/061268 (counterpart to related U.S. Appl. No. 14/120,067).
Officer: Jim Lindquist, "International Search Report", dated Dec. 17, 2012, issued in related International Patent Application No. PCT/EP2012/061268 (counterpart to related U.S. Appl. No. 14/126,067).
"Non-Final Office Action", dated Oct. 8, 2014, issued in related U.S. Appl. No. 14/126,067.
"Notice of Allowance", dated Apr. 17, 2015, issued in related U.S. Appl. No. 14/126,067.
Yue Zhang et al, "Compact Modeling of Perpendicular-Anisotrophy CoFeB/MgO Magnetic Tunnel Junctions", Mar. 2012, pp. 819-826, vol. 59, No. 3.
Lionel Torres et al., "Evaluation of hybrid MRAM/CMOS cells for reconfigurable computing", Published in: FR.
Luqiao Liu, et al, "Magnetic switching by spin torque from the spin Hall effect", Published in: US.
Saied Tehrani, et al, "Magnetoresistive Random Access Memory Using Magnetic Tunnel Junctions", "Proceedings of the IEEE", May 2003, pp. 703-714, vol. 91, No. 5.
Ioan Minai Miron et al, "Perpendicular switching of a single ferromagnetic layer induced by in-plane current injection", "Nature; DOI: 10.1038/nature10309.11", Aug. 11, 2011, pp. 189-194, vol. 476, Publisher: Macmillan Publishers Limited.
L. Q. Liu et al., "Spin-Torque Switching with the Giant Spin Hall Effect of Tantalum", 2012, vol. 336, No. 555.

(56) References Cited

OTHER PUBLICATIONS

I L Prejbeanu et al., "Thermally assisted MRAM", "Journal of Physics: Condensed Matter", Apr. 6, 2007, p. 23 Publisher: IOP Publishing, Published in: UK.

Zhao et al., "TAS-MRAM based Non-volatile FPGA logic circuit", Dec. 1, 2007, pp. 153-160, Publisher: International Conference on Field-Programmable Technology. ICFPT 2007. IEEE, XP031208385.

William C. Black, Jr.et al., "Programmable logic using giant-magnetoresistance and spin-dependent tunneling devices invited", May 1, 2000, pp. 6674-6679, vol. 87, No. 9, Publisher: AIP Publishing.

G. Grynkewich et al, "Nonvolatile Magnetoresistive Random-Access Memory Based on Magnetic Tunnel Junctions", Nov. 2014, pp. 818-821.

Yoann Guillemenet et al, "A Non-Volatile Run-Time FPGA Using Thermally Assisted Switching MRAMS", pp. 421-426.

Sasikanth Manipatruni et al, "Voltage and Energy-Delay Performance of Giant Spin Hall Effect Switching for Magnetic Memory and Logic", pp. 1-16.

IBM, "Combined Single/Dual-Port Array Approach with 6-Device Cell", "IBM Technical Disclosure Bulletin", Jun. 1, 1988, pp. 291-292, vol. 31, No. 1, Publisher: IBM Corp., Published in: US; XP000021499.

Yamamoto, et al., "Nonvolatile Static Random Access Memory Using Resistive Switching Devices: Variable-Transconductance Metal Oxide Semiconductor Field-Effect-Transistor Approach", "Japanese Journal of Applied Physics", Apr. 1, 2010, pp. 40209-1, vol. 49, No. 4, Publisher: Japan Society of Applied Physics, Published in: JP; XP001553987.

\* cited by examiner

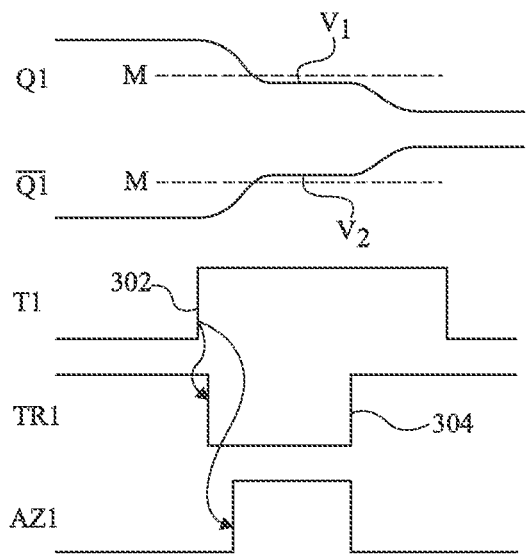
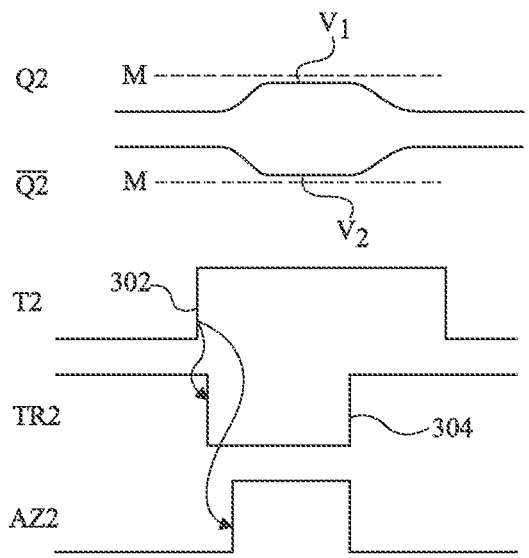
Fig 3A                                    Fig 3B
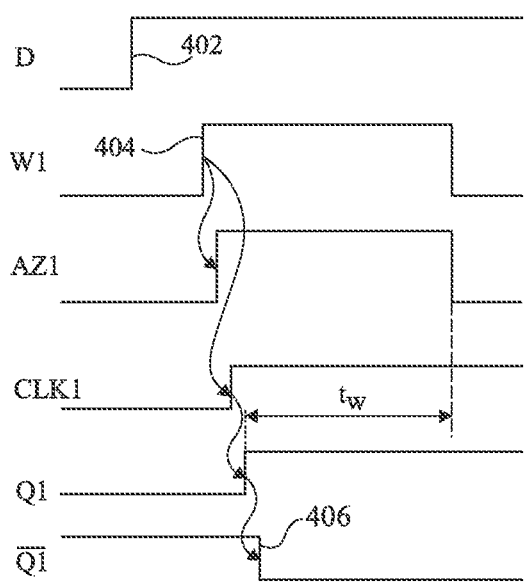
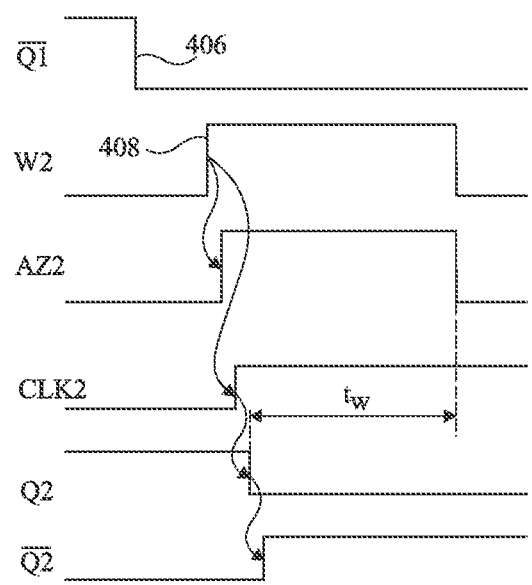
Fig 4A                                    Fig 4B

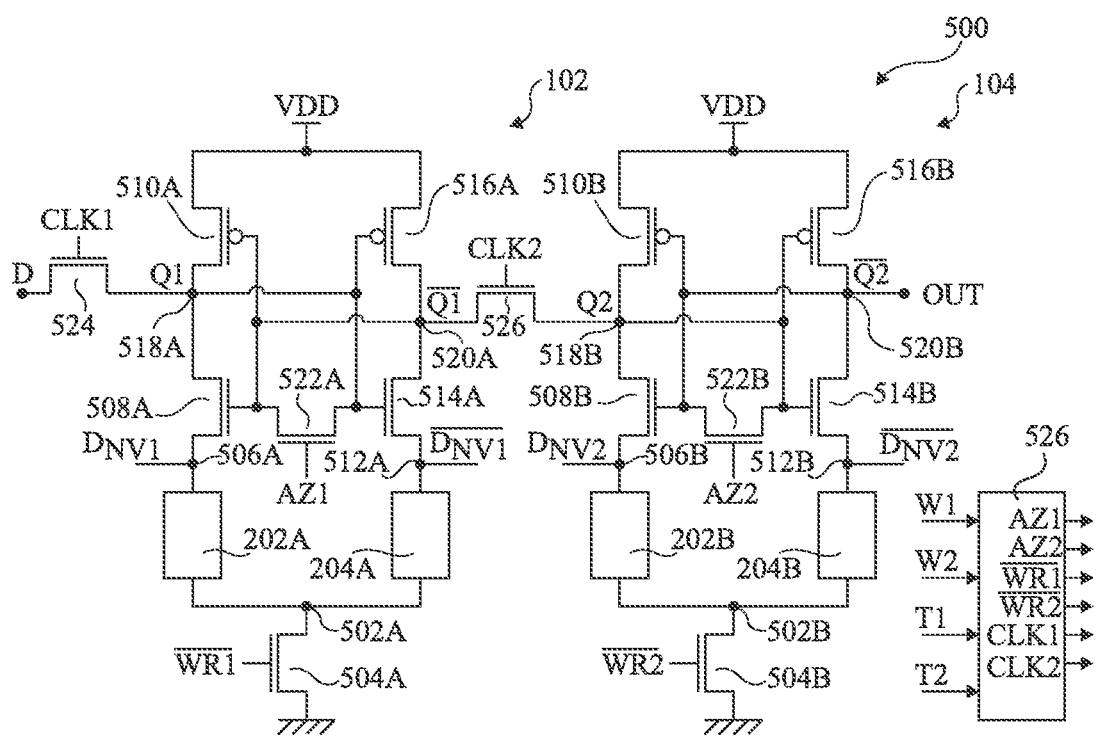
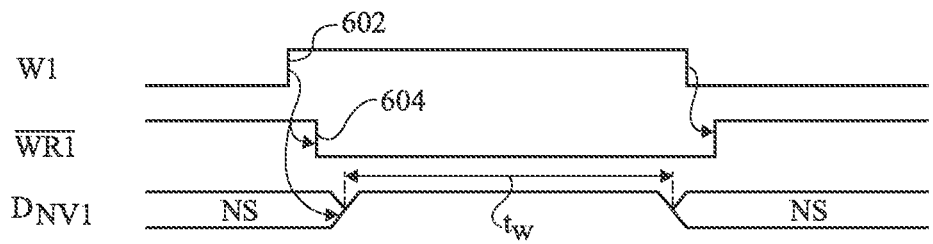
Fig 6A
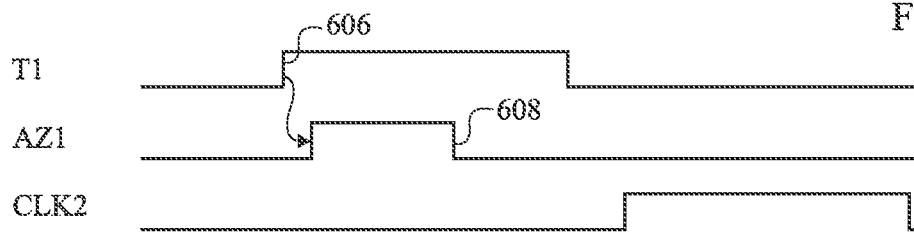
Fig 6B
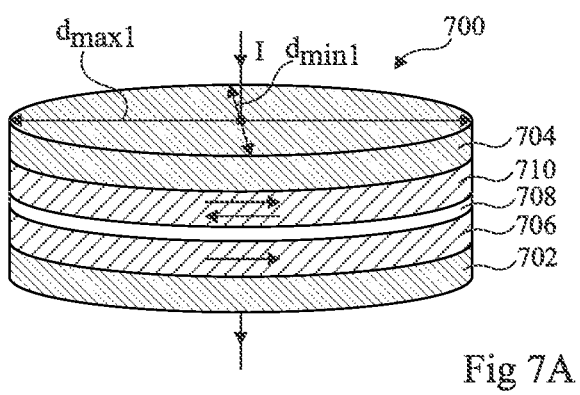
Fig 7A
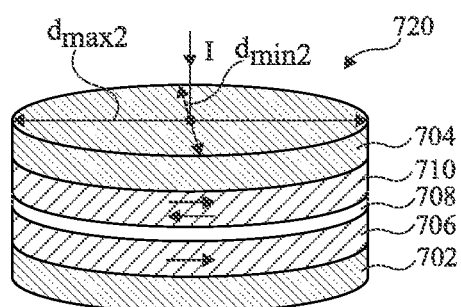
Fig 7B

NON-VOLATILE MEMORY DEVICE

FIELD

The present disclosure relates to a memory device comprising non-volatile data storage elements, and to a method of storing data by programming non-volatile data storage elements of a memory device.

BACKGROUND

It has been proposed to use programmable resistive elements in memory cells to provide non-volatile data storage. Such resistive elements are programmable to adopt one of a plurality of different resistive states. The programmed resistive state is maintained even when a supply voltage of the memory cell is disconnected, and thus data can be stored by such elements in a non-volatile fashion.

Various types of resistive elements have been proposed, some of which are capable of being programmed by the direction of a current that is passed through them. An example of such a current-programmable resistive element is an STT (spin transfer torque) element, which is based on magnetic tunnel junctions (MTJs).

Such non-volatile elements are generally associated with a minimum data retention duration during which the data stored by these elements can be reliably retrieved. While it is possible to provide non-volatile elements with relatively long data retention durations, for example of several years or more, the longer the retention duration, the more energy consuming a write operation of the elements tends to be.

There is a need in the art for a memory device providing improved energy efficiency during write operations.

SUMMARY

It is an aim of embodiments of the present description to at least partially address one or more problems in the prior art.

According to one aspect, there is provided a memory device comprising: a first memory cell comprising a first resistive non-volatile data storage element programmable to store a first bit of data; and a second resistive memory cell comprising a second non-volatile data storage element programmable to store a second bit of data; wherein said first resistive element is configured to have a first data retention duration, and said second resistive element is configured to have a second data retention duration different from said first data retention duration.

According to one embodiment, the second data retention duration is at least 50 percent shorter or longer than the first data retention duration.

According to one embodiment, the second data retention duration is at least 10 times shorter or longer than said first data retention duration.

According to one embodiment, a physical characteristic of the first resistive element is different from a corresponding physical characteristic of the second resistive element.

According to one embodiment, at least one dimension of said first resistive element is different from a corresponding dimension of said second resistive element.

According to one embodiment, the first memory cell comprises a first data latch coupled to said first resistive element; and the second memory cell comprises a second data latch coupled to the second resistive element and to the first data latch.

According to one embodiment, a data storage node of the first data latch is coupled to an input node of the memory device for receiving an input data signal, and a data storage node of the second data latch is coupled to an output node of the memory device.

According to one embodiment, the first resistive element is programmable to have one of at least two resistive states and the first memory cell comprises a third resistive element, the first bit of data being represented by the relative resistances of the first and third resistive elements; and the second resistive element is programmable to have one of at least two resistive states and the second memory cell comprises a fourth resistive element, the second bit of data being represented by the relative resistances of the second and fourth resistive elements.

According to one embodiment, the first resistive element is coupled between a first storage node of the first data latch and a first intermediate node, and the third resistive element is coupled between a second storage node of the first data latch and a second intermediate node, the first memory cell further comprising: a first transistor of the first latch coupled between the first storage node and a first supply voltage; a second transistor of the first latch coupled between the second storage node and the first supply voltage, wherein a control node of the first transistor is coupled to the second storage node and a control node of said second transistor is coupled to said first storage node; a third transistor coupled between the first and second intermediate nodes; and control circuitry configured to active said third transistor while applying a second supply voltage to said first or second storage node to generate a programming current in a selected direction through said first and third resistive elements to program the resistive state of at least one of said elements.

According to one embodiment, the memory device further comprises: a fourth transistor coupled between said first intermediate node and said second supply voltage; and a fifth transistor coupled between said second intermediate node and said second supply voltage, wherein said control circuitry is further configured to transfer the data value represented by the resistive states of said first and third resistive elements to said first and second storage nodes by activating said fourth and fifth transistors.

According to one embodiment, the first and second memory cells are each coupled to read-write circuitry comprising a latch and configured to transfer data between said first and second memory cells.

According to one embodiment, the first memory cell is coupled to the read-write circuitry via first and second bit lines, and wherein the second memory cell is coupled to the read-write circuitry via third and fourth bit lines.

According to one embodiment, each of the first and second resistive elements is one of: a spin transfer torque element with in-plane anisotropy; a spin transfer torque element with perpendicular-to-plane anisotropy; a thermally assisted switching element; a reduction oxide (RedOx) element; a ferro-electric element; and a phase change element.

According to one embodiment, the first and second resistive elements are each spin transfer torque elements with in-plane anisotropy or perpendicular-to-plane anisotropy and formed of a plurality of stacked layers, wherein the volume of at least one of the layers of said first resistive element is different from a corresponding layer of said second resistive element.

According to one aspect, there is provided a method of storing an input data value in non-volatile storage of a memory device, the memory device comprising a first memory cell comprising a first resistive non-volatile data storage element programmable to store a first bit of data; and a second memory cell comprising a second resistive nonvolatile data storage element programmable to store a second bit of data, wherein said first resistive element is configured to have a first data retention duration, and said second resistive element is configured to have a second data retention duration different from said first data retention duration, the method comprising: selecting, based on a data retention duration associated with said input data value, one of said first and second resistive elements; and programming the selected resistive element to store the input data value.

BRIEF DESCRIPTION OF THE DRAWINGS

The foregoing and other features and advantages will become apparent from the following detailed description of embodiments, given by way of illustration and not limitation with reference to the accompanying drawings, in which:

FIGS. 3A and 3B are timing diagrams representing signals in the circuit of FIG. 2 during a data transfer phase according to an example embodiment of the present disclosure;

FIGS. 4A and 4B are timing diagrams representing signals in the circuit of FIG. 2 during a write phase according to an example embodiment of the present disclosure;

FIG. 5 schematically illustrates the device of FIG. 1A in more detail according to a further example embodiment of the present disclosure;

FIG. 6A is a timing diagram representing signals in the circuit of FIG. 5 during a write phase according to an example embodiment of the present disclosure;

FIG. 6B is a timing diagram representing signals in the circuit of FIG. 5 during a data transfer phase according to an example embodiment of the present disclosure;

FIGS. 7A and 7B illustrate resistive elements based on magnetic tunnel junctions according to example embodiments of the present disclosure;

DETAILED DESCRIPTION

Figure 1A:
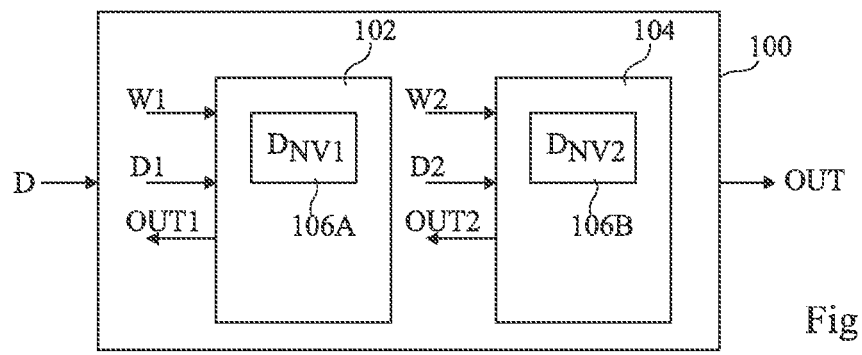
FIG. 1A schematically illustrates a memory device according to an embodiment of the present disclosure.

Throughout the following description, specific embodiments are described in which the resistive states of non-volatile resistive elements of the memory cells are programmed by the direction of a current that is passed through them. It will however be apparent to those skilled in the art how the principles described herein could be equally applied to other types of non-volatile elements, such as those programmed by the direction of a magnetic field or by the magnitude of a current passed through them, and elements storing data in other forms than a programmed resistance.

FIG. 1 schematically illustrates a memory device 100 according to an example embodiment.

Device 100 comprises memory cells 102 and 104. Memory cell 102 has inputs for receiving a data signal D1 and a write phase signal W1, and an output for providing output data OUT1. Memory cell 104 has inputs for receiving a data signal D2 and a write phase signal W2, and an output for providing output data OUT2.

The device 100 for example receives input data D, and provides output data OUT. The value of the input data values D1 and D2 to the memory cells may be equal to the input data D, or one or both of data values D1, D2 may be independent of this data value.

The memory cell 102 comprises at least one non-volatile data storage element 106A that stores a bit of data $D_{NV1}$ in a non-volatile fashion. Similarly, the memory cell 104 comprises at least one non-volatile data storage element 106B that stores a bit of data $D_{NV2}$ in a non-volatile fashion. As will become apparent from the specific embodiments described below, the values of the data bits $D_{NV1}$ and $D_{NV2}$ may be entirely independent of each other.

The elements 106A, 106B are any type of non-volatile storage element. For example they can be a type of resistance switching element for which the resistance is programmable, for example by the direction of a current passed through them. In some embodiments, the resistive elements 106A, 106B are the same type of element as each other, but in other embodiments it would be possible to use different types of non-volatile elements to implement each of them.

The elements 106A, 106B are for example based on magnetic tunnel junctions (MTJs), such as field-induced magnetic switching (FIMS) elements, thermally assisted switching (TAS) elements, STT (spin-torque-transfer) elements, or those of Toggle MRAM. FIMS-MRAM (magnetic random access memory) are for example discussed in more detail in the publication titled "Magnetoresistive random access memory using magnetic tunnel junctions", S. Tehrani, Proceedings of IEEE, 91(5):3707-714, May 2003. TAS-MRAM are for example discussed in more detail in the publication titled "Thermally Assisted MRAM", Prejbeanu et al.

In another example described in more detail below with reference to FIGS. 7A and 7B, the elements 106A, 106B are spin transfer torque elements with in-plane or perpendicular-to-plane anisotropy, as described in more detail in the publication entitled "Magnonic spin-transfer torque MRAM with low power, high speed, and error-free switching", N. Mojumder et al., IEDM Tech. Digest (2010), and in the publication entitled "Electric toggling of magnets", E. Tsymbal, Natural Materials Vol 11, January 2012.

Alternatively, the elements 106A, 106B could be other types of non-volatile storage elements such as resistance switching memory devices, including those used in programmable metallization cells (PMC), such as oxide resistive RAM (OxRRAM), conductive bridging RAM (CBRAM), FeRAM (Ferro-Electric RAM) or phase change RAM (PCRAM). As a further example, the elements 202, 204 could be those used in RedOx RAM (reduction oxide RAM), which are for example described in more detail in the publication entitled "Redox-Based Resistive Switching Memories—Nanoionic Mechanisms, Prospects and Challenges", Rainer Waser et al., Advanced Materials 2009, 21, pages 2632 to 2663.

The write phase signal W1 controls a write phase of the data $D_{NV1}$ stored by the element 106A, and the write phase signal W2 controls a write phase of the data $D_{NV2}$ stored by the element 106B.

Each of the memory cells 102, 104 for example comprises circuitry implementing a data latch (not illustrated in FIG. 1A), and a clock signal CLK1 may additionally be provided to the memory cell 102 to control the timing of when the input data signal D1 is latched into the memory cell 102, and a clock signal CLK2 may additionally be provided to the memory cell 104 to control the timing of when the input data D2 is latched into the memory cell 104.

Each of the elements 106A, 106B is associated with a retention duration, corresponding to the duration that the data $D_{NV1}$, $D_{NV2}$ is reliably stored by the respective element 106A, 106B. At the end of the retention duration, there is a significant probability that it will no longer be possible to retrieve the original data value. As will now be described in more detail with reference to FIG. 1B, the resistive elements 106A and 106B have physical differences with respect to each other, meaning that the retention duration of element 106A is not the same as the retention duration of element 106B.

Figure 1B:
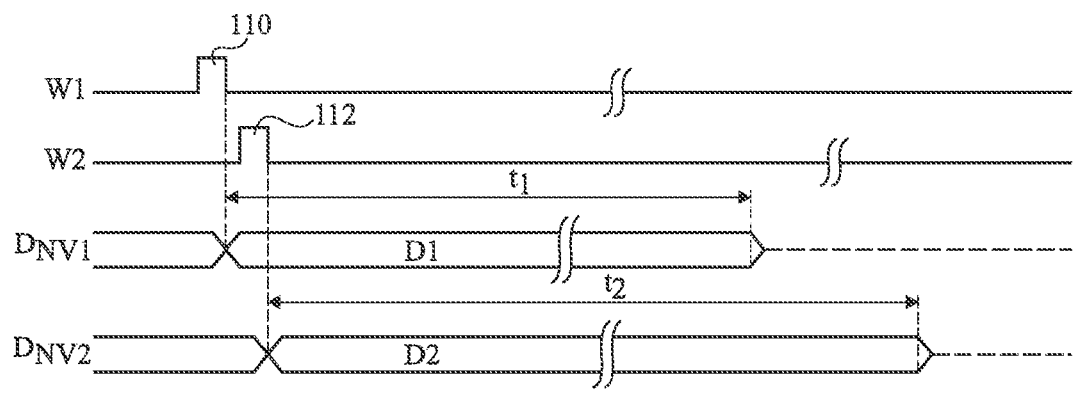
FIG. 1B is a timing diagram illustrating data stored by the device of FIG. 1 according to an example embodiment.

FIG. 1B is a timing diagram illustrating the write signals W1 and W2, and the data $D_{NV1}$ and $D_{NV2}$ of the memory cells 102 and 104 respectively according to an example embodiment.

As illustrated, a high pulse 110 of the write signal W1 for example corresponds to a write phase of the memory cell 102 during which a data value D1 is written to the element 106A, such that the value of $D_{NV1}$ becomes D1 at the end of the high pulse 110. It is then assumed that there is no new write phase, the resistive element 106A maintaining the value D1 until the end of its retention duration $t_1$, which is for example between several seconds and several years.

A high pulse 112 of the write signal W2 shortly after the high pulse 110 for example corresponds to a write phase of the memory cell 104 during which the data value D2 is written to the element 106B, such that the value of $D_{NV2}$ becomes D2 at the end of the high pulse 110. It is again assumed that there is no new write phase, and the resistive element 106B maintains the value D2 until the end of its retention duration $t_2$. As illustrated, the retention duration $t_2$ is longer than $t_1$, but in alternative embodiments it could be shorter. For example the duration $t_2$ is at least 50 percent longer or shorter than $t_1$. In some embodiments, the duration $t_2$ is at least 10 times longer or shorter than $t_1$. In one example, $t_1$ is equal to 1 month or less and $t_2$ is equal to 12 months or more, or vice versa.

In some embodiments, a method of selecting the data retention duration of an input data value to be stored in a non-volatile fashion involves selectively programming the elements 106A or 106B with the input data value based on a desired retention duration. For example, a control signal is provided to the memory device 100 indicating the desired data retention duration for a given bit of data. For data values that are only needed to be stored for relatively short periods, the element having the lowest retention period can be selected, thereby economizing energy.

The memory device 100 of FIG. 1 is for example any type of non-volatile memory device comprising a plurality of memory cells, and could be implemented as a sequential, combinational, synchronous or asynchronous memory device. For example, device 100 coupled correspond to a single memory array comprising the memory cells 102 and 104 as two of its addressable cells. Alternatively, one or more of the addressable cells of a memory device could comprise the memory device 100.

Figure 2:
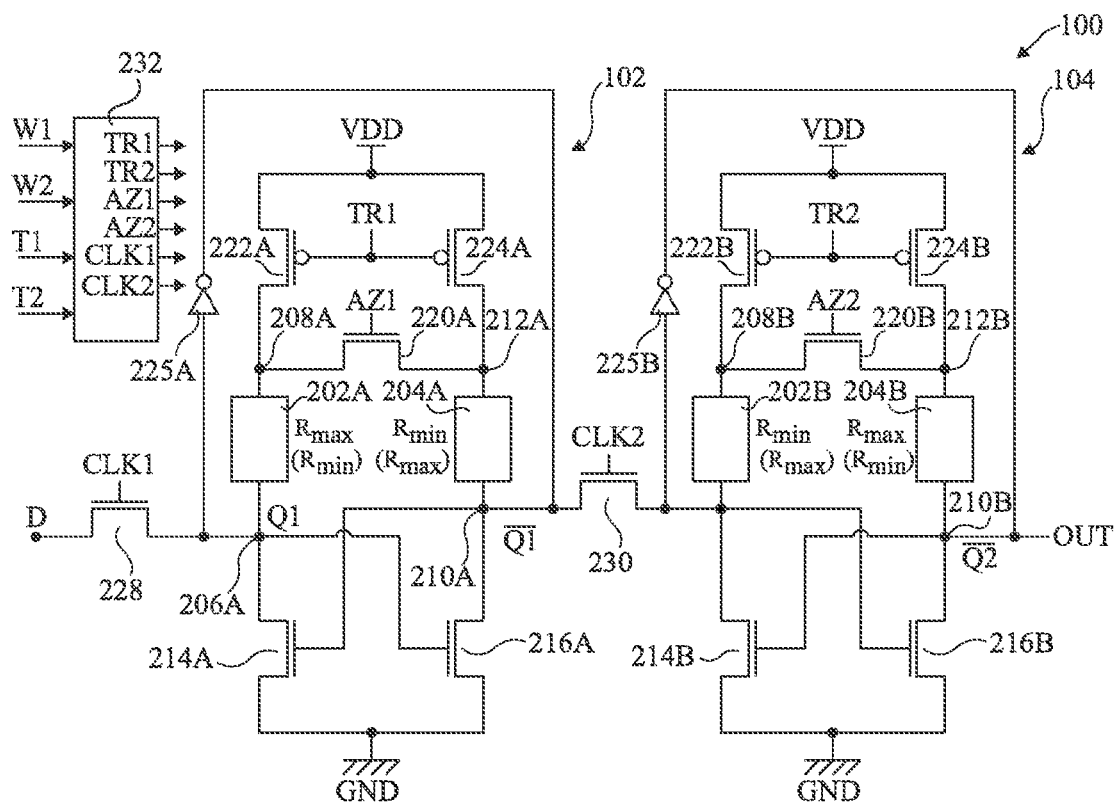
FIG. 2 schematically illustrates the device of FIG. 1A in more detail according to an example embodiment of the present disclosure.

FIG. 2 schematically illustrates the memory device 100 of FIG. 1A in more detail according to an example embodiment, in the case that device 100 is a synchronous device. In particular, in the example of FIG. 2, the memory cells 102, 104 are coupled together to form a flip-flop.

Each of the memory cells 102, 104 comprises a pair of resistive elements, labelled 202A and 204A in memory cell 102, and 202B and 204B in memory cell 104, forming the non-volatile data storage elements. A bit of data is for example stored in each memory cell in a non-volatile manner by setting one of the elements at a relatively high resistance $R_{max}$, and the other at a relatively low resistance $R_{min}$. In FIG. 2, the element 202A and 204B are shown programmed to have a resistance $R_{max}$ and the elements 204A and 202B a resistance $R_{min}$, and as shown by the references $R_{min}$ and $R_{max}$ in brackets, the opposite programming of the resistance values would be possible.

Each of the resistive elements 202A, 204A, 202B, 204B for example has just two resistive states corresponding to the high and low resistances $R_{max}$ and $R_{min}$, but the exact values of $R_{min}$ and $R_{max}$ may vary depending on conditions such as process, materials, temperature variations etc.

The non-volatile data bit represented by the resistive elements 202A, 204A, or by the resistive elements 202B, 204B, depends on which of the resistive elements is at the resistance $R_{max}$ and $R_{min}$, in other words on the relative resistances. The resistive elements are for example selected such that $R_{max}$ is always significantly greater than $R_{min}$, for example at least 20 percent greater. In general, the ratio between the resistance $R_{max}$ and the resistance $R_{min}$ is for example between 1.2 and 10000. $R_{min}$ is for example in the region of 2 k ohms or less, and $R_{max}$ is for example in the region of 6 k ohms or more, although many other values are possible It will be apparent to those skilled in the art that in some embodiments, rather than both of the resistive elements 202A, 204A of the memory cell 102 being programmable, only one can be programmable. Similarly, rather than both of the resistive elements 202B, 204B of the memory cell 104 being programmable, only one can be programmable. In such cases, the other resistive element of each memory cell for example has a fixed resistance at an intermediate level around halfway between $R_{min}$ and $R_{max}$, for example equal, within a 10 percent tolerance, to $(R_{min}+(R_{max}-R_{min})/2)$. For example, one of the resistive elements 202A, 204A and/or 202B, 204B, could correspond to a resistor of fixed resistance. Alternatively, one of the resistive elements 202A, 204A and/or 202B, 204B could be formed of a pair of programmable resistive elements coupled in parallel with each other and in opposite orientations, such that irrespective of the sense in which each element is programmed, the resistance value remains relatively constant at the intermediate level.

Referring now to the memory cell 102, the resistive element 202A is coupled between a storage node 206A and an intermediate node 208A. The resistive element 204A is coupled between a storage node 210A and an intermediate node 212A. The storage nodes 206A and 210A store voltages Q1 and $\overline{Q1}$ respectively. A pair of inverters is cross-coupled between the storage nodes 206A and 210A to form a data latch. Each inverter is formed by a single transistor 214A, 216A respectively. Transistor 214A is for example an n-channel MOS (NMOS) transistor coupled by its main current nodes between node 206A and ground. Transistor 216A is for example an NMOS transistor coupled by its main current nodes between the storage node 210A and ground. A control node of transistor 214A is coupled to the storage node 210A, and a control node of transistor 216A is coupled to the storage node 206A. The intermediate nodes 208A and 212A are coupled together via the main current nodes of an NMOS transistor 220A. Transistor 220A receives at its control node a signal AZ1 described in more detail below.

The node 208A is further coupled to a supply voltage $V_{DD}$ via the main current nodes of a p-channel MOS (PMOS) transistor 222A. Similarly, the node 212A is coupled to the supply voltage $V_{DD}$ via the main current nodes of a PMOS transistor 224A. Control nodes of the PMOS transistors 222A and 224A are coupled together to a transfer signal TR1 described in more detail below.

The memory cell 102 for example further comprises an inverter 225A coupled between the storage node 206A and the storage node 210A, although in some embodiments this inverter could be omitted.

The memory cell 104 is for example substantially identical to the memory cell 102, and the components have been labelled with like reference numerals, except that the "A" of each reference has been replaced by a "B". As with the memory cell 102, in some embodiments the inverter 225B could be omitted. The voltage at storage nodes 206B, 210B are labelled Q2 and $\overline{Q2}$ respectively. Transistor 220B is controlled by a signal AZ2 and transistors 222B and 224B are controlled by a signal TR2.

The storage node 206A receives an input data signal D via an NMOS transistor 228. The storage node 210A of memory cell 102 is for example coupled to the storage node 206B of memory cell 104 via an NMOS transistor 230. Transistor 228 is for example controlled by the clock signal CLK1, and transistors 230 and 226B are for example controlled by the clock signal CLK2.

FIG. 2 also illustrates a control block 232, providing the control signals TR1, TR2, AZ1, AZ2, CLK1 and CLK2 to the corresponding transistors of the memory cells 102, 104. As illustrated, these control signals are for example generated based on the write signals W1, W2 and transfer phase signals T1 and T2.

In the memory cell 102, each inverter of the data latch is implemented by a single transistor 214A, 216A, and the high state of Q1 or $\overline{Q1}$ is maintained by leakage current passing through the PMOS transistors 222A or 224A. The threshold voltages of the PMOS transistors 222A and 224A are chosen to be lower than those of NMOS transistors 214A and 216A respectively, such that when in the non-conducting state, the current leakage through transistors 222A or 224A is greater than through transistor 214A or 216A respectively, thereby keeping the corresponding node 206A or 210A at a voltage high enough to be seen as a high logic state. In other words, the leakage current $I_{offP}$ flowing through PMOS transistor 222A, 224A when a high voltage is applied to the corresponding gate nodes is greater that the leakage current $I_{offN}$ flowing through the corresponding NMOS transistor 214A, 216A when a low voltage is applied to its gate node. The particular threshold voltages will depend on the technology used. As an example, the threshold voltages of PMOS transistors 222A, 224A are chosen to be in the range 0.3 to 0.5 V, while the threshold voltages of NMOS transistors 214A, 216A are chosen to be in the range 0.4 to 0.6 V. In any case, the ratio $I_{OffP}/I_{OffN}$ is selected for example to be greater than 25, and preferably greater than 100. The above applies mutatis mutandis to the memory cell 104.

Operation of the circuit of FIG. 2 will now be described in more detail with reference to FIGS. 3A and 3B, and 4A and 4B.

First, it should be noted that each of the memory cells 102, 104 is capable of storing, in a volatile fashion, a data bit that is independent of the programmed resistive states of the elements 202A and 204A or of elements 202B and 204B. Indeed, the latch formed by transistors 214A/214B and 216A/216B will maintain any stored state.

FIGS. 3A and 3B are timing diagrams showing signals in the memory cell of FIG. 2 during a transfer phase of the memory cells 102 and 104 respectively.

FIG. 3A illustrates the data signals Q1 and $\overline{Q1}$ present at the storage nodes 206A and 210A, the transfer phase signal T1, the transfer signal TR1, and the signal AZ1 during a transfer phase of the memory cell 102. The transfer phase corresponds to an operation for transferring the data represented by the programmed resistive states of the resistive elements 202A and 204A to the storage nodes 206A, 210A. Thus, the data is transformed from being represented by programmed resistive states to being represented by voltage levels at the storage nodes 206A and 210A. The transfer phase involves setting the levels of the voltages Q1 and $\overline{Q1}$ based on the programmed resistive states.

In the example of FIG. 3A, it is assumed that the resistive element 202A has been programmed to have a high resistance $R_{max}$, and the resistive element 204A a low resistance $R_{min}$. While not shown in FIGS. 3A and 3B, during the transfer phase, the clock signals CLK1 and CLK2 for example remain low. It is also assumed that Q1 and $\overline{Q1}$ are initially at a high state and low state respectively. The term "high state" is used herein to designate a voltage level close to or at the level of the supply voltage $V_{DD}$, while the term "low state" is used herein to designate a voltage level close to or at the ground voltage. The transfer signal TR1 is for example initially high, such that transistors 222A and 224A are non-conducting. The signal AZ1 is for example initially low, such that transistor 220A is non-conducting.

The transfer phase signal T1, which is for example initially low, is asserted as shown by a rising edge 302, triggering shortly thereafter a falling edge of the transfer signal TR1, and a rising edge of the signal AZ1, for example shortly after the falling edge of the transfer signal TR1. Thus the transistors 220A, 222A and 224A are all activated, inducing a current in the left-hand and right-hand branches of the memory cell 102. However, due to the difference in the resistances of the resistive elements 202A and 204A, the current in the left-hand branch is lower than the current in the right-hand branch. Thus these currents for example cause the voltage at storage node 206A to fall and settle at a level $V_1$ below a level of metastability M, and the voltage at storage node 210A to rise to a level $V_2$ above the level of metastability M. The level of metastability M is a theoretical voltage level approximately halfway between the high and low voltage states, representing the level from which there would be equal probability of Q1 flipping to the high or low states. Asserting the signal AZ1 to turn on transistor 220A has the effect of speeding up the descent of the voltage level Q1, and the rise of the voltage level $\overline{Q1}$.

The signal AZ1 is then brought low, and the transfer signal TR1 is brought high again at a rising edge 304, such that the levels of Q1 and $\overline{Q1}$ go to their closest stable state, which in the example of FIG. 3A corresponds to the low Q1, high $\overline{Q1}$ state. However, it will be apparent to those skilled in the art that the levels $V_1$ and $V_2$, and the final stable state, will depend on factors such as the on resistances of the transistors 214A, 216A, 222A and 224A. Finally, the transfer phase signal T1 goes low to complete the transfer phase.

FIG. 3B illustrates the data signals Q2 and $\overline{Q2}$ present at the storage nodes 206B and 210B, the transfer phase signal T2, the transfer signal TR2, and the signal AZ2 during a transfer phase of the memory cell 104. In the example of FIG. 3B, it is assumed that the resistive element 202B has been programmed to have a high resistance $R_{max}$, and the resistive element 204B a low resistance $R_{min}$, and that the voltages Q2 and $\overline{Q2}$ are initially at a low state and high state respectively. The transfer phase signal T2, transfer signal TR2 and the signal AZ2 have the same forms as the corresponding signals in FIG. 3A, and will not be described again. The difference with respect to FIG. 3A is that, when the signal TR2 is brought low and the signal AZ2 is brought high, the voltage Q2 rises to the level $V_1$, and the voltage $\overline{Q2}$ falls to the level $V_2$. After that, the levels of Q2 and $\overline{Q2}$ go to their closest stable state, which in the example of FIG. 3B corresponds to the low Q2, high $\overline{Q2}$ state. Again it will be apparent to those skilled in the art that the levels $V_1$ and $V_2$, and the final stable state, will depend on factors such as the on resistances of the transistors 214B, 216B, 222B and 224B.

FIG. 4A is a timing diagram illustrating examples of the signals D, W1, AZ1, CLK1, Q1 and $\overline{Q1}$ in the memory cell 102 during a write phase of the resistive states of the resistive elements 202A and 204A. While not shown in FIG. 4A during the write phase, the transfer signal TR1 for example remains high such that transistors 222A and 224A are non-conducting.

The write phase involves passing a current through each of the resistive elements 202A, 204A via the transistor 220A, either in the direction from the storage node 206A to the storage node 210A, or the opposite direction. The resistive elements 202A and 204A are each orientated such that, for a given direction of current, they will be programmed to have opposite resistances. In particular, each resistive element 202A, 204A can be orientated in one of two ways between the corresponding storage node 206A, 210A and corresponding intermediate node 208A, 212A. In the case of an STT element, the orientation is determined by the order of a pinned layer and storage layer, as will be described in more detail below. The elements 202A, 204A are both for example orientated in the same way between these corresponding nodes, for example each having their pinned layer closest to the corresponding storage node 206A, 210A, such that they have opposite orientations with respect to a write current flowing from the storage node 206A to storage node 210A or vice versa.

Initially the signals AZ1 and CLK1 are low, and it is assumed that Q1 is initially low, and $\overline{Q1}$ is initially high. The data signal D at the input of the memory cell 102 is for example set to the value that is to be programmed in the memory cell, which in the example of FIG. 4A is a logic "1" after a rising edge 402.

The write phase signal W1 then goes high at a rising edge 404, initiating the start of the write phase. This triggers, a short time later, a rising edge of the signal AZ1, such that the transistor 220A is activated, coupling together the nodes 208A and 212A. Furthermore, shortly thereafter, the clock signal CLK1 is asserted, such that Q1 becomes equals to the data signal D. This causes a current to flow through the resistive elements 202A and 204A in a direction that will program their resistances in accordance with the logic "1" data value that is to be programmed. In the example of FIG. 2, a high state of a data value D for example corresponds to a high value of voltage Q1, and a resistance $R_{min}$ of element 202A, and a resistance $R_{max}$ of element 204A. After the current has been applied for a sufficiently long time to set the resistive states of elements 202A and 204A, for example for a duration $t_W$ of between 0.1 ns and 20 ns, the signal AZ1 is brought low, stopping the write current, and the signals W1 is then for example brought low, ending the write phase.

FIG. 4B is a timing diagram illustrating examples of the signals $\overline{Q1}$, W2, AZ2, CLK2, Q2 and $\overline{Q2}$ in the memory cell 104 during a write phase of the resistive states of the resistive elements 202B and 204B, in which the data value to be programmed is the logic "0" stored at the storage node 210A during the write phase of the memory cell 102 illustrated in FIG. 2. A rising edge 408 of the write signal W2 triggers a rising edge of the signal AZ2 and CLK2, in order to generate a current from the storage node 210B through the resistive elements 204B and 202B, to the storage node 206B, for the duration $t_W$. This programs a resistance $R_{min}$ of element 202B, and a resistance $R_{max}$ of element 204B.

The transistor 220A is for example dimensioned such that the write current generated by activating this transistor is high enough to program the resistive states of elements 202A and 204A. Similarly, the transistor 220B is for example dimensioned such that the write current generated by activating this transistor is high enough to program the resistive states of elements 202B and 204B. The dimensions of transistors 220A and 220B, and in particular at least their widths, are for example different from each other. For example, the width of transistor 220A is for example at least 10 percent greater or less than the width of transistor 220B. Indeed, in view of the different retention durations of the resistive elements 202A, 204A compared with the resistive elements 202B, 204B, the write currents in each of the memory cells 102, 104 are for example different. For example, a minimum programming current in each of the memory cells 102, 104 could for example by anything from 20 µA to 1.5 mA, and the programming current used in memory cell 102 is for example at least 10 percent greater or less than the programming current used in memory cell 104.

Transistors 214A, 216A, 222A and 224A in memory cell 102 are for example dimensioned such that, during a transfer phase when the transfer signal TR1 is activated, the level of current flowing through the resistive elements 202A and 204A is lower than that needed to program their resistive states, for example a level between 10 and 90 percent lower than the corresponding write current. Similarly, transistors 214B, 216B, 222B and 224B in memory cell 104 are for example dimensioned such that, during a transfer phase when the transfer signal TR2 is activated, the level of current flowing through the resistive elements 202B and 204B is lower than that needed to program their resistive states, for example a level between 10 and 90 percent lower than the corresponding write current.

FIG. 4A illustrates the case in which the data value of the data signal D at the input of the memory cell 102 is written to the resistive elements 202A, 204A by asserting the clock signal CLK1, and FIG. 4B illustrates the case in which the data value $\overline{Q1}$ at the storage node 210A is written to the resistive elements 202B, 204B by asserting the clock signal CLK2. In alternative embodiments, the clock signals CLK1 and/or CLK2 could remain inactive, and separate write circuitry (not illustrated in FIG. 2) could be used to selectively apply a high voltage to the storage node 206A or 210A, and/or to the storage node 206B or 210B, to create the corresponding write current.

FIG. 5 schematically illustrates the device 100 of FIG. 1A in more detail according to a further example embodiment in the case that the memory device is a flip-flop.

In the embodiment of FIG. 5, the memory cell 102 comprises resistive elements 202A, 204A each having one terminal coupled to a common node 502A, which is in turn coupled to ground via an NMOS transistor 504A controlled by a signal $\overline{WR1}$. The other terminal of resistive element 202A is coupled to an intermediate node 506A, which is in turn coupled to a supply voltage $V_{DD}$ via an NMOS transistor 508A and a PMOS transistor 510A coupled in series and forming an inverter. Similarly, the other terminal of resistive element 204A is coupled to an intermediate node 512A, which is in turn coupled to a supply voltage $V_{DD}$ via an NMOS transistor 514A and a PMOS transistor 516A coupled in series and forming an inverter. The transistors 508A, 510A, 514A and 516A together form a data latch. The node 518A between transistors 508A and 510A forms a storage node of the data latch storing a voltage Q1, and is coupled to the control nodes of transistors 514A and 516A. The node 520A between transistors 512A and 516A forms another storage node of the latch storing a voltage $\overline{Q1}$, and is coupled to the control nodes of transistors 508A and 510A. The nodes 518A, 520A are further coupled together via an NMOS transistor 522A controlled by a signal AZ1.

The memory cell 104 is for example substantially identical to the memory cell 102, and the components have been labelled with like reference numerals, except that the "A" of each reference has been replaced by a "B". The transistor 504B is controlled by a signal $\overline{WR2}$ and the transistor 522B is controlled by a signal AZ2. The voltage at node 518B is labelled Q2, and the voltage at node 520B is labelled $\overline{Q2}$.

The storage node 518A of memory cell 102 receives an input data signal D via an NMOS transistor 524 controlled by a clock signal CLK1. The storage node 520A of memory cell 102 is coupled to the storage node 518B of memory cell 104 via an NMOS transistor 526 controlled by a clock signal CLK2. A control block 526 is for example provided, which receives write phase signals W1 and W2, and transfer phase signals T1 and T2, and generates the control signals AZ1, AZ2, $\overline{WR1}$, $\overline{WR2}$, CLK1 and CLK2.

The operation of the circuit of FIG. 5 is similar to that of the circuit of FIG. 2, except that the data value $D_{NV1}$ to be written to the resistive elements 202A, 204A is supplied via dedicated write circuitry (not illustrated in FIG. 5) coupled to the nodes 506A and 512A during a write phase, and the data value $D_{NV2}$ to be written to the resistive elements 202B, 204B is supplied via dedicated write circuitry (also not illustrated in FIG. 5) coupled to the nodes 506B, 512B.

The operation of the circuit of FIG. 5 during write and transfer phases will now be described in more detail with reference to FIGS. 6A and 6B.

FIG. 6A is a timing diagram illustrating the signals W1, $\overline{WR1}$ and $D_{NV1}$ during a write phase of the resistive states of the resistive elements 202A and 204A of the memory cell 102 of FIG. 5.

The write phase signal W1 for example goes high at a rising edge 602 at the start of the write phase, triggering a falling edge 604 of the signal $\overline{WR1}$, thereby deactivating transistor 504A. Shortly afterwards, the data signal $D_{NV1}$ is for example applied to the node 506A, and its inverse to node 512A, to generate a write current in a direction through the resistive elements 202A and 204A based on the data to be programmed. In the example of FIG. 6A, a high voltage level is applied to node 506A for a write period $t_w$. For example, as represented by the letters NS, no signal is applied to the nodes 506A and 512A before and after the write period. At the end of the write period $t_w$, the write phase signal W1 for example goes low, which triggers rising edge of the signal $\overline{WR1}$ to reactivate transistor 504A.

A write phase of the resistive elements 202B, 204B of the memory cell 104 is for example implemented in the same fashion as that of the memory cell 102.

FIG. 6B is a timing diagram illustrating the signals T1, AZ1 and CLK2 during a transfer phase of the data represented by the resistive elements 202A, 204A in the memory cell 102 to the output OUT of the device.

During the transfer phase, the transistor 504A for example remains activated. A transfer phase is for example initiated by a rising edge 602 of the transfer phase signal T1. This triggers, shortly thereafter, a rising edge of the signal AZ1, thereby activating transistor 522A. This has the effect of equalizing to some extent the voltages at the storage nodes Q1 and $\overline{Q1}$, and causing a current to flow through the left-hand and right-hand branches of the memory cell 102. When the signal AZ1 is brought low by a falling edge 608, the storage nodes Q1 and $\overline{Q1}$ will go to their closest stable state based on the relative resistances of the elements 202A and 204A. The transfer phase signal T1 then for example goes low, ending the transfer phase.

The transferred data is then for example provided at the output of the device by asserting the clock signal CLK2 to write the value at the storage node 520A to the storage node 518B.

FIGS. 7A and 7B illustrate examples of the structures of resistive spin transfer torque (STT) elements having different retention times according to an example embodiment. For example, the resistive elements 106A, 202A and 204A described herein each has a structure corresponding to that of FIG. 7A, and the resistive elements 106B, 202B, 204B described herein each has a structure corresponding to that of FIG. 7B, or vice versa.

FIG. 7A illustrates an STT resistive element 700 with in-plane magnetic anisotropy. The element 700 is for example substantially cylindrical, but has a cross-section which is non-circular, for example oval, with a maximum diameter $d_{max1}$ greater than a minimum diameter $d_{min1}$. The element 700 comprises bottom and top electrodes 702 and 704, each being substantially disc-shaped, and sandwiching a number of intermediate layers between them. The intermediate layers comprise, from bottom to top, a pinned layer 706, an oxidation barrier 708, and a storage layer 710.

The oxidation barrier 708 is for example formed of MgO or $Al_xO_y$. The pinned layer 706 and storage layer 710 are for example ferromagnetic materials, such as CoFe. The spin direction in the pinned layer 706 is fixed, as represented by an arrow from left to right in FIG. 7A. Of course, in alternative embodiments the spin direction could be from right to left in the pinned layer 706. However, the spin direction in the storage layer 710 can be changed, as represented by arrows in opposing directions in FIG. 7A. The spin direction is programmed by the direction of the write current I passed through the element, such that the spin direction in the storage layer is parallel, in other words in the same direction, or anti-parallel, in other words in the opposite direction, to that of the pinned layer 706.

FIG. 7B illustrates an STT resistive element 720 also with in-plane magnetic anisotropy. Again, element 720 is substantially cylindrical, but for example has a cross-section which is non-circular, for example oval, with a maximum diameter $d_{max2}$ greater than a minimum diameter $d_{min2}$. Otherwise, the layers forming the element 720 are the same as those forming the element 700, and have been labelled with like reference numerals and will not be described again in detail.

The ratio between the minimum and maximum diameters $d_{max1}/d_{min1}$ of element 700 is for example greater than the corresponding ratio $d_{max2}/d_{min2}$ of element 720. In other words, $d_{max1}$ is greater than $d_{max2}$ and/or $d_{min1}$ is less than $d_{min2}$. This leads to a longer data retention duration of element 700 when compared to element 720.

While in the examples of FIGS. 7A and 7B, the resistive elements 700 and 720 are illustrated as having cross-sections that are oval in shape, in alternative embodiments other forms would be possible, such as rectangular.

It will be apparent to those skilled in the art that it would be possible to achieve a difference in the retention duration between the memory cells 102 and 104 in alternative ways to the examples of FIGS. 7A and 7B, depending on the particular technology employed for forming the elements. In general, the retention duration of a resistive element is a function of the product KV, where K is specific to the material or to its aspect ratio for the magnetic layers of an element with in-plane magnetic anisotropy, and V is the volume of the storage layer. Thus the retention duration of a resistive element is dependent on the size, shape, thickness of its storage layer and the types of materials used to form its layers. In some embodiments, the difference between the retention duration of the memory cell 102, 104 is brought about by providing a difference in one or more corresponding dimensions of the resistive elements of each memory cell, such as the thickness and/or volume of the storage layer. Additionally or alternatively, the difference in the retention durations could be achieved by a difference in the material used to form one or more of the layers of the resistive elements of each cell. For example, a pinned and/or storage layer of the resistive elements of each memory cell 102, 104 could be formed by a different appropriate combination of materials selected among the list: Co, Pt, Cr, Pd, Ni, Ta, Fe, B, MgO and AlOx.

For example, in another embodiment, the non-volatile data storage elements 106A, 106B are implemented by STT resistive elements with perpendicular-to-plane magnetic anisotropy. Such a type of programmable resistive element has a layered structured very similar to the in-plane elements of FIGS. 7A and 7B, but is advantageous as it may in general be programmed by a lower write current. For this type of resistive element, the difference in the retention duration between the memory cells 102 and 104 is for example achieved by a difference in the volume of at least one of the layers forming the resistive elements. For example, the thicknesses of the storage layers of the STT elements are different from each other.

Figure 8:
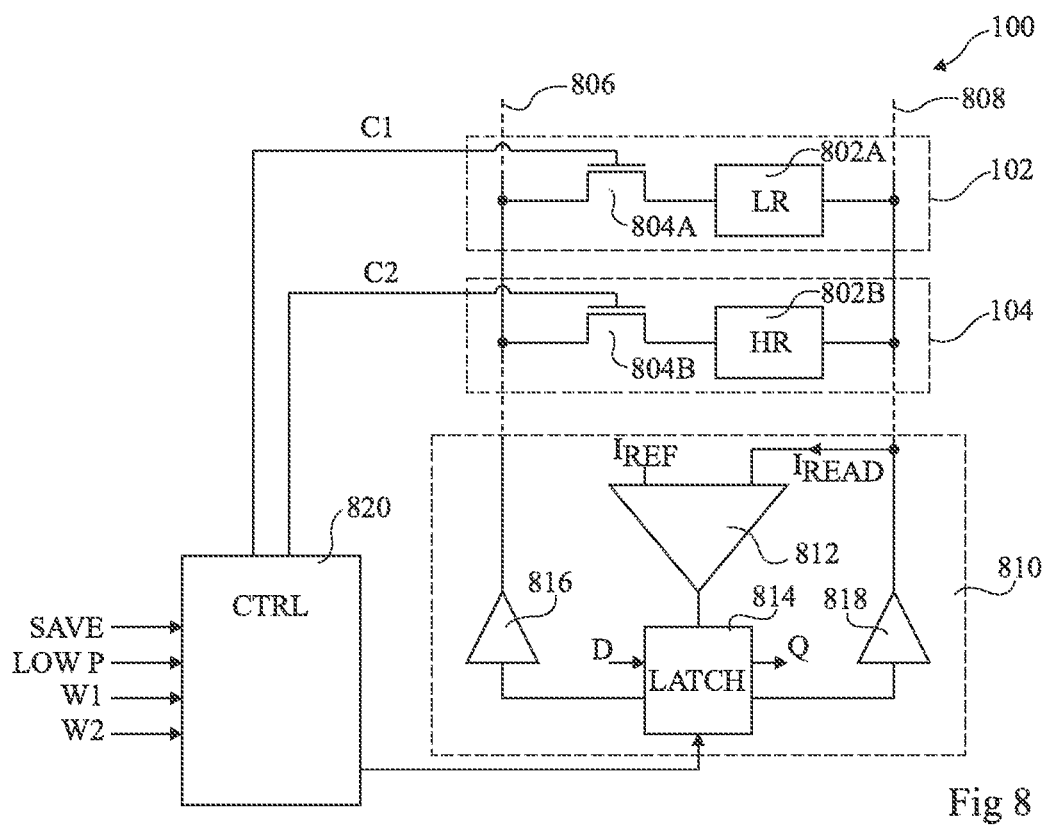
FIG. 8 schematically illustrates the device of FIG. 1A in more detail according to a further example embodiment of the present disclosure.

FIG. 8 schematically illustrates the memory device 100 of FIG. 1A in more detail according to a further example embodiment, in the case that device 100 is a memory array.

In the device of FIG. 8, the memory cell 102 comprises a resistive element 802A forming the non-volatile data storage element of the cell and for example having a relatively low retention duration LR, and the memory cell 104 comprises a resistive element 802B forming the non-volatile data storage element of the cell and for example having a relatively high retention duration HR.

The elements 802A, 802B are each coupled in series with a respective selection transistor 804A, 804B between bit lines 806 and 808. While only two memory cells 102, 104 are illustrated in FIG. 8, there could be any number of such cells coupled between the bit lines 806, 808. In some embodiments, there are an equal number of LR cells 102 and HR cells 104. In some embodiments there could also be other cells having yet another retention duration, for example between that of the LR and HR cells. Furthermore, the circuit of each cell 102 shown in FIG. 8 is merely one example, many other arrangements being possible, including differential arrangements with two resistive elements similar to the cells illustrated in FIG. 2.

The bit lines 806, 808 are each coupled to read-write circuitry 810, which allow data to be written to and read from the memory cells 102, 104. The read-write circuitry 810 for example comprises a comparator 812, having an input coupled to the bit line 808, and an output coupled to a latch 814. The latch 814 for example receives a data signal D, representing data to be stored in the memory array, and outputs data Q read from a memory cell. The latch 814 is in turn coupled to drive elements 816, 818, that have their outputs coupled to the bit lines 806 and 808 respectively.

A control block 820 controls the latch 814 and generates selection signal C1 and C2 for controlling the selection transistors 804A, 804B respectively. The control block 820 for example receives a signal "SAVE", indicating when data is to be transferred from one or more LR cells 102 to one or more HR cells 104, and a signal "LOW P" indicating when data is to be transferred from one or more HR cells 104 to one or more LR cells 102.

In operation, during a write phase, data can be written to an LR or HR cell, as determined by the signal W1 and W2.

When the write signal W1 is asserted, the data signal D is stored in the latch 814, and then for example written to the LR cell 102. This is for example achieved by activating the selection transistor 804A, and applying by the drive elements 816, 818 a current of a magnitude and/or direction for programming the element 802A based on the data stored in the latch.

When the write signal W2 is asserted, the data signal D is stored in the latch 814, and then for example written to the HR cell 104. This is for example achieved by activating the selection transistor 804B, and applying by the drive elements 816, 818 a current of a magnitude and/or direction for programming the element 802B based on the data stored in the latch.

During a read phase, a cell to be read is selected by activating the corresponding selection transistor, and a voltage is for example applied to the bit line 806 by the drive element 816. The current $I_{READ}$ at the input of the comparator 812 is thus proportional to programmed resistance of the storage element, and by comparing this current to a reference current $I_{REF}$, the programmed state of the resistive element of the cell can be detected by the comparator 812, and stored in the latch 814. The reference current $I_{REF}$ is for example generated by applying a voltage to an element of resistance equal to a mid-value between the resistances $R_{min}$ and $R_{max}$ of the resistive elements, which could be implemented by coupling a pair of the storage elements in parallel with each other, but in opposite directions.

In addition to the write and read operations described above, data may also be transferred between LR and HR cells, as will now be described with reference to FIGS. 9A and 9B.

Figure 9A:
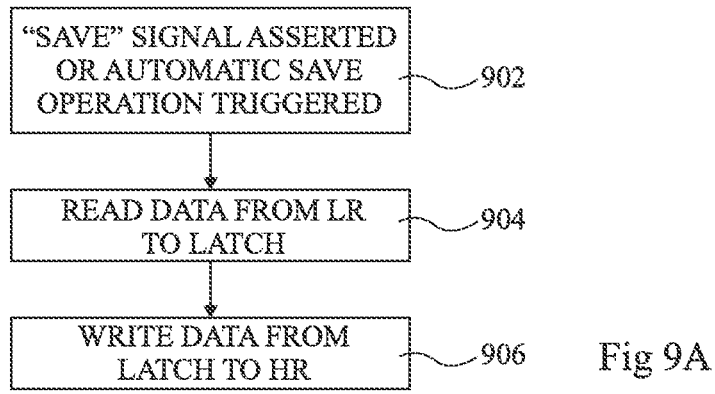
FIGS. 9A and 9B are flow diagrams illustrating steps in methods of transferring data in the device of FIG. 8.

FIG. 9A illustrates steps in a save operation.

In an initial step 902, the "SAVE" signal is asserted, or an automatic save operation is triggered. For example, the memory array may be configured to periodically save the data stored in one or more LR cells to one or more HR cells, in order to back up the data. Alternatively, the control block 820 may automatically trigger the save operation based on a determined average retention duration of the low retention elements. For example, the control block 820 comprises a counter that estimates the average retention duration of the low retention duration elements in each sector of the memory, for example each column, line or bank of memory elements. This information is then used to determined how frequently the save operation should be conducted, while allowing a suitable margin such that data is not lost.

In a subsequent step 904, data is read from the LR cell 102 to the latch 814, this operation being similar to the read operation described above.

In a subsequent step 906, the data read to the latch 814 is written to an HR cell, this operation being similar to a write operation as described above.

The steps 904 and 906 may be repeated for other LR cells in the column of memory cells.

Figure 9B:
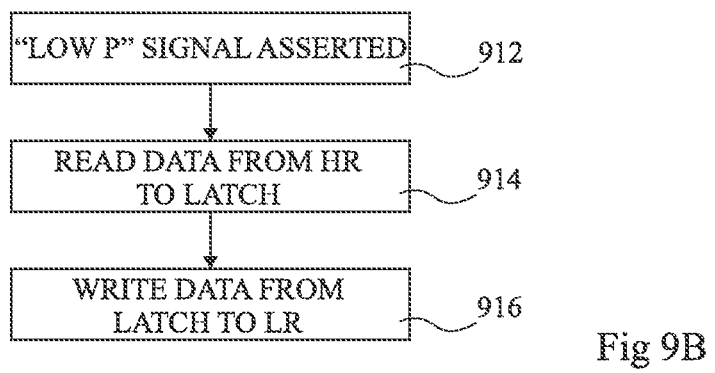

FIG. 9B illustrates steps in an operation for reverting to a low power mode.

In an initial step 912, the low power signal LOW P is asserted.

In a subsequent step 914, data is read from the HR cell 104 to the latch 814, this operation being similar to the read operation described above.

In a subsequent step 916, the data is written from the latch 814 to the LR cell 102, this operation being similar to a write operation as described above.

The steps 914 and 916 may be repeated for other HR cells in the column of memory cells.

Figure 10:
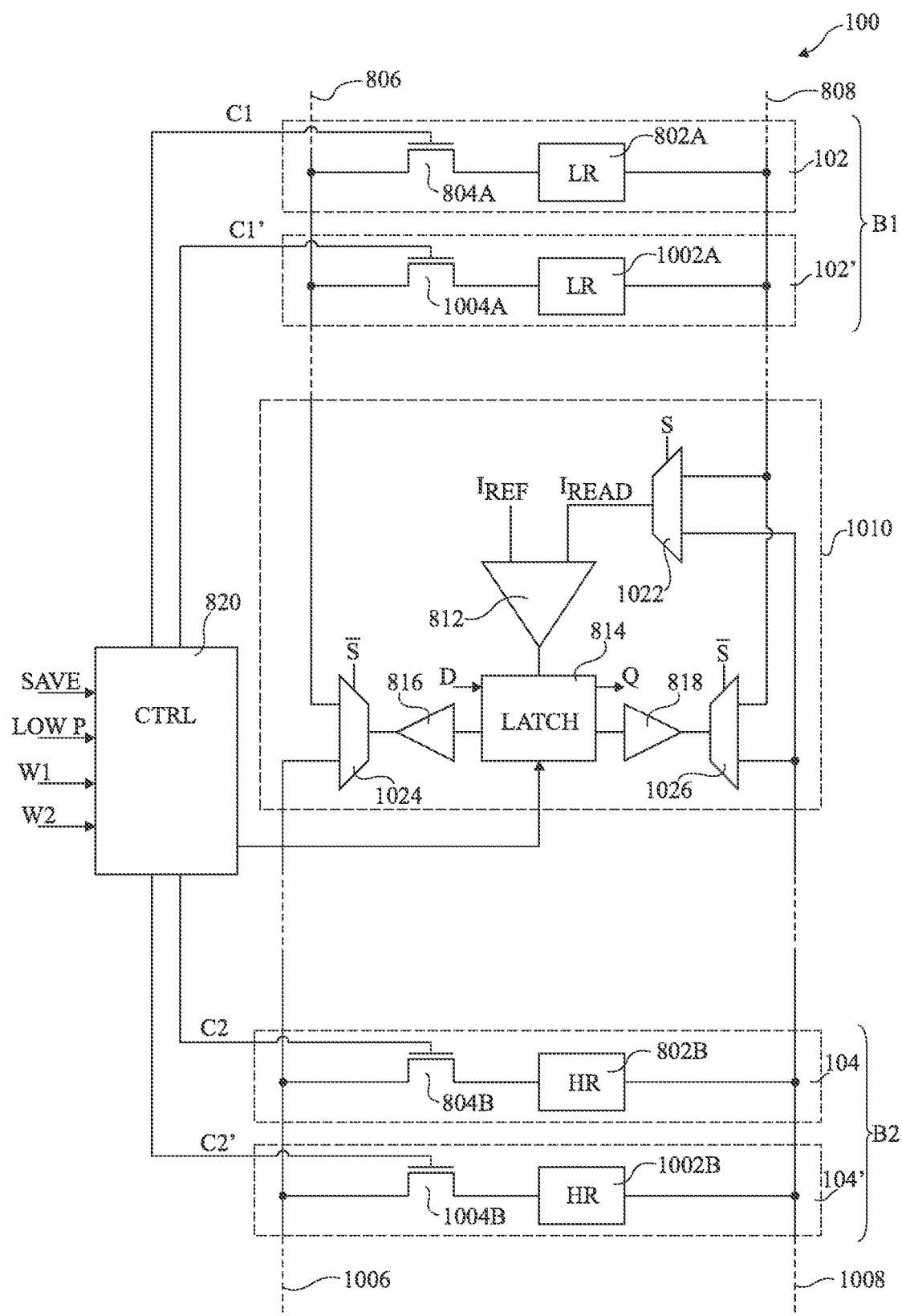
FIG. 10 schematically illustrates the device of FIG. 1A in more detail according to yet a further example embodiment of the present disclosure.

FIG. 10 schematically illustrates the memory device 100 of FIG. 1A in more detail according to a further example embodiment very similar to that of FIG. 8, and like features have been labelled with like reference numerals and will not be described again in detail.

In the device of FIG. 10, two separate banks of memory cells are provided, each coupled to read-write circuitry 1010, which is common to both banks of memory cells.

The memory cell 102 forms part of a bank B1, along with another LR cell 102', which comprises a resistive element 1002A and a selection transistor 1004A coupled in series between the bit lines 806, 808. Of course, the bank B1 may comprise many more memory cells, all of which are for example LR cells.

The memory 104 forms part of another bank B2, along with another HR cell 104'. Both of the memory cells 104 and 104' are coupled between bit lines 1006 and 1008, rather than between the bit lines 806, 808. The cell 104' comprises a resistive element 1002B and a selection transistor 1004B coupled in series between the bit lines 1006, 1008.

The read-write circuitry 1010 is similar to the circuitry 810, except that it additionally comprises a multiplexers 1022, and demultiplexers 1024 and 1026. Multiplexer 1022 has two inputs respectively coupled to the bit lines 808 and 1008, and an output providing the input to the comparator 812. Demultiplexer 1024 has an input coupled to the output of the drive element 816, and a two outputs coupled to the bit lines 806 and 1006 respectively. Demultiplexer 1026 has an input coupled to the output of the drive element 818, and two outputs coupled to the bit lines 808 and 1008 respectively. The multiplexer 1022 is controlled by a selection signal S, and the demultiplexers 1024, 1026 for example by the inverse of this selection signal.

Operation of the device of FIG. 10 during a write or read operation is very similar to that of the device of FIG. 8, except that that the demultiplexers 1024 and 1026, as well as the selection signals C1, C1' etc., are controlled in order to select a memory cell to be written or read.

Operation of the device of FIG. 10 during a transfer operation is also very similar to that of the device of FIG. 8, except that when data is to be read, the multiplexer 1022 is controlled to select the appropriate bit line 808 or 1008. Furthermore, data transfers can be performed more quickly because data can be read from one of the banks of memory cells at the same time as data is written to the other.

An advantage of the embodiments described herein is that, by providing programmable resistive elements of different data retention durations in separate memory cells of a synchronous memory device, the most energy efficient resistive element for a desired retention duration can be selected for a given data value, thereby economizing energy. For example, the resistive element with the lowest retention time can be used most frequently, and the resistive element with a long retention time could be used sporadically to provide long term data backup.

Having thus described at least one illustrative embodiment, various alterations, modifications and improvements will readily occur to those skilled in the art.

For example, it will be apparent to those skilled in the art that the supply voltage $V_{DD}$ in the various embodiments could be at any level, for example between 1 and 3 V, and rather that being at 0 V, the ground voltage can also be considered as a supply voltage that could be at any level, such as a negative level.

Furthermore, it will be apparent to those skilled in the art that, in any of the embodiments described herein, all of the NMOS transistors could be replaced by PMOS transistors and/or all of the PMOS transistors could be replaced by NMOS transistors. It will be apparent to those skilled in the art how any of the circuits could be implemented using only PMOS or only NMOS transistors. Furthermore, while transistors based on MOS technology are described throughout, in alternative embodiments other transistor technologies could be used, such as bipolar technology.

Furthermore, it will be apparent to those skilled in the art that the various features described in relation to the various embodiments could be combined, in alternative embodiments, in any combination.

The invention claimed is:

1. A memory device comprising:
a first memory cell comprising a first resistive non-volatile data storage element programmable to store a first bit of data and a first data latch coupled to said first resistive element; and
a second memory cell comprising a second resistive non-volatile data storage element programmable to store a second bit of data and a second data latch coupled to said second resistive element and to said first data latch;
wherein said first resistive element is configured to have a first data retention duration, and said second resistive element is configured to have a second data retention duration different from said first data retention duration; and
wherein a data storage node of said first data latch is coupled to an input node of the memory device for receiving an input data signal, and a data storage node of said second data latch is coupled to an output node of the memory device.

2. The memory device of claim 1, wherein said second data retention duration is at least 50 percent shorter or longer than said first data retention duration.

3. The memory device of claim 1, wherein said second data retention duration is at least 10 times shorter or longer than said first data retention duration.

4. The memory device of claim 1, wherein a physical characteristic of the first resistive element is different from a corresponding physical characteristic of the second resistive element.

5. The memory device of claim 1, wherein at least one dimension of said first resistive element is different from a corresponding dimension of said second resistive element.

6. A memory device comprising:
a first memory cell comprising a first resistive non-volatile data storage element programmable to store a first bit of data and a first data latch coupled to said first resistive element; and
a second memory cell comprising a second resistive non-volatile data storage element programmable to store a second bit of data and a second data latch coupled to said second resistive element and to said first data latch;
wherein:
said first resistive element is configured to have a first data retention duration, and said second resistive element is configured to have a second data retention duration different from said first data retention duration;
said first resistive element is programmable to have one of at least two resistive states and said first memory cell comprises a third resistive element, said first bit of data being represented by the relative resistances of the first and third resistive elements;

said second resistive element is programmable to have one of at least two resistive states and said second memory cell comprises a fourth resistive element, said second bit of data being represented by the relative resistances of the second and fourth resistive elements; and the first resistive element is coupled between a first storage node of said first data latch and a first intermediate node, and the third resistive element is coupled between a second storage node of said first data latch and a second intermediate node, the first memory cell further comprising:

a first transistor of said first latch coupled between said first storage node and a first supply voltage;

a second transistor of said first latch coupled between said second storage node and said first supply voltage, wherein a control node of said first transistor is coupled to said second storage node and a control node of said second transistor is coupled to said first storage node;

a third transistor coupled between the first and second intermediate nodes; and control circuitry configured to activate said third transistor while applying a second supply voltage to said first or second storage node to generate a programming current in a selected direction through said first and third resistive elements to program the resistive state of at least one of said elements.

7. The memory device of claim 6, further comprising:

a fourth transistor coupled between said first intermediate node and said second supply voltage; and a fifth transistor coupled between said second intermediate node and said second supply voltage, wherein said control circuitry is further configured to transfer the data value represented by the resistive states of said first and third resistive elements to said first and second storage nodes by activating said fourth and fifth transistors.

8. The memory device of claim 1, wherein said first and second memory cells are each coupled to read-write circuitry comprising a latch and configured to transfer data between said first and second memory cells.

9. The memory device of claim 8, wherein said first memory cell is coupled to said read-write circuitry via first and second bit lines, and wherein said second memory cell is coupled to said read-write circuitry via third and fourth bit lines.

10. The memory device of claim 1, wherein each of said first and second resistive elements is one of:

a spin transfer torque element with in-plane anisotropy;

a spin transfer torque element with perpendicular-to-plane anisotropy;

a thermally assisted switching element;

a reduction oxide element;

a ferro-electric element; and a phase change element.

11. A memory device comprising:

a first memory cell comprising a first resistive non-volatile data storage element programmable to store a first bit of data; and a second memory cell comprising a second resistive non-volatile data storage element programmable to store a second bit of data;

wherein said first resistive element is configured to have a first data retention duration, and said second resistive element is configured to have a second data retention duration different from said first data retention duration; and wherein said first and second resistive elements are each spin transfer torque elements with in-plane anisotropy or perpendicular-to-plane anisotropy and formed of a plurality of stacked layers, wherein the volume of at least one of the layers of said first resistive element is different from a corresponding layer of said resistive second element.

12. A method of storing an input data value in non-volatile storage of a memory device, the memory device comprising a first memory cell comprising a first resistive non-volatile data storage element programmable to store a first bit of data; and a second memory cell comprising a second resistive non-volatile data storage element programmable to store a second bit of data, wherein said first resistive element is configured to have a first data retention duration, and said second resistive element is configured to have a second data retention duration different from said first data retention duration wherein said first and second resistive elements are each spin transfer torque elements with in-plane anisotropy or perpendicular-to-plane anisotropy and formed of a plurality of stacked layers, wherein the volume of at least one of the layers of said first resistive element is different from a corresponding layer of said resistive second element, the method comprising:

selecting, based on a data retention duration associated with said input data value, one of said first and second resistive elements; and programming the selected resistive element to store the input data value.

\* \* \* \* \*